(12) United States Patent
Zhang et al.

(10) Patent No.: US 8,816,264 B2
(45) Date of Patent: Aug. 26, 2014

(54) CMOS IMAGE SENSOR SWITCH CIRCUIT FOR REDUCED CHARGE INJECTION

(75) Inventors: Guangbin Zhang, Cupertino, CA (US); Dennis Lee, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 239 days.

(21) Appl. No.: 13/563,181

(22) Filed: Jul. 31, 2012

(65) Prior Publication Data

US 2014/0034808 A1    Feb. 6, 2014

(51) Int. Cl.
  *H03K 17/56*   (2006.01)
(52) U.S. Cl.
  USPC ........................................ 250/208.1; 327/419
(58) Field of Classification Search
  USPC .......... 250/208.1; 327/419; 348/302, 303, 304
  See application file for complete search history.

(56) References Cited

U.S. PATENT DOCUMENTS

| | | |
|---|---|---|
| 2005/0174277 A1 | 8/2005 | Tani et al. |
| 2010/0321090 A1* | 12/2010 | Blair .............................. 327/434 |
| 2013/0015905 A1* | 1/2013 | Briere ............................ 327/434 |
| 2013/0182164 A1 | 7/2013 | Duggal et al. |
| 2013/0257515 A1* | 10/2013 | Ladurner et al. .............. 327/434 |

OTHER PUBLICATIONS

Sakakibara, M. et al., "A High-Sensitivity CMOS Image Sensor With Gain-Adaptive Column Amplifiers," IEEE Journal of Solid-State Circuits, vol. 40, No. 5, May 2005, pp. 1147-1156.
Solhusvik, J. et al., "A 1.2MP 1/3" Global Shutter CMOS Image Sensor with Pixel-Wise Automatic Gain Selection," 2011 International Image Sensor Workshop, Hakodate-Onuma Prince Hotel, Hokkaido, Japan, Session 12 Global Shutter Sensors, Jun. 11, 2011, R53 (3 pages).

* cited by examiner

*Primary Examiner* — Tony Ko
(74) *Attorney, Agent, or Firm* — Blakely Sokoloff Taylor & Zafman LLP

(57) ABSTRACT

A switch circuit including structures to reduce the effects of charge injection. In an embodiment, a first transistor of the switch circuit is to receive a first signal and first and second dummy transistors of the switch circuit are each to receive a second signal, wherein the first transistor is connected between the first and second dummy transistors. The second signal is complementary to the first signal. In another embodiment, the first transistor, the first dummy transistor and the second dummy transistors are each connected via respective body connections to a first low supply voltage.

19 Claims, 7 Drawing Sheets

CMOS IMAGE SENSOR SWITCH CIRCUIT FOR REDUCED CHARGE INJECTION

BACKGROUND

1. Technical Field

Embodiments variously relate to switch circuitry and, particularly, but not exclusively, to use of such switch circuitry in readout circuit of a complementary metal-oxide semiconductor ("CMOS") image sensor.

2. Background Art

Switch circuits are often found in semiconductor devices such as CMOS image sensors. A popular form of switch circuit is a sample and hold circuit, which can operate in many applications such as data conversion and switch-capacitor filtering. FIG. 1 shows a circuit diagram of conventional switch circuit 100. Switch circuit 100 includes n-channel MOS (NMOS) transistor 110 and capacitor 120 connected in series with one another between an input port and an output port. When NMOS transistor 110 is switched on, by asserting control signal CTRL 130, the switch circuit 100 is closed to allow charging of capacitor 120. When CTRL 130 is de-asserted, switch circuit 100 is open. One problem with switch circuit 100—as with similar switches—is charge injection that takes place as a result of CTRL 130 being de-asserted. Charge injection redistributes charge in the channel of NMOS transistor 110, which tends to introduce noise to the output terminal of NMOS transistor 110.

A conventional technique for addressing charge injection is to operate switch circuit 100 with a boosted version of control signal CTRL 130. However, applying a boosted control voltage to the gate of NMOS transistor 110 over time results in accelerated device failure. Another technique for addressing charge injection is to connect a dummy circuit, such as dummy transistor 150, between NMOS transistor 110 and capacitor 120. Dummy transistor 150, responsive to control signal CTRLB 135, operates as a MOS capacitor to reduce charge injection from NMOS transistor 110 to capacitor 120. CTRLB 135 is substantially inverse of CTRL 130.

As integrated circuit fabrication techniques continue to improve, successive generations of smaller and/or faster semiconductor devices are increasingly sensitive to sources of signal noise such as charge injection.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments variously provide for operation of a switch circuit with reduced charge injection characteristics. In an embodiment, two dummy transistors of a switch circuit are connected to different respective terminals—e.g. source and drain—of a first transistor of the switch circuit for switched exchanges between an input node and an output node. Such dummy transistors may, for example, balance charge injection across source and drain terminals of the first transistor.

The first transistor and the two dummy transistors may each have smaller channels—e.g. as compared to the channels of one or more other transistors included in and/or coupled to the switch circuit. A smaller channel may allow each of the first transistor and the two dummy transistors to be driven by a lower voltage for operation in a narrower voltage range than that of other circuitry included in, or powering, the switch circuit.

For example, operation of the first transistor and two dummy transistors may be powered using a first high supply voltage DVDD and/or a first low supply voltage DVSS—e.g. where such transistors are each connected via respective body connections to first low supply voltage DVSS. One or more other circuit elements of the switch circuit may be powered using a second high supply voltage VDD and/or a second low supply voltage VSS. A level of second high supply voltage VDD may, for example, be higher than a level of first high supply voltage DVDD. Alternatively or in addition, a level of second low supply voltage VSS may be lower than a level of first low supply voltage DVSS.

In an embodiment, a power supply circuit which powers the switch circuit may allow the levels of supply voltages DVSS, DVDD to float within the voltage range between VSS and VDD. Such floating of supply voltages DVSS, DVDD may accommodate multiple switch circuits of a semiconductor device which variously draw from the power supply circuit. For example, the power supply circuit may reduce the effect of differences in operation of the multiple switch circuits, where such differences are due to variations in circuitry resulting from IC fabrication. Floating DVDD and DVSS allows certain embodiments to variously provide significant reduction in readout mismatch, as compared to previous pixel array readout techniques.

Figure 1:
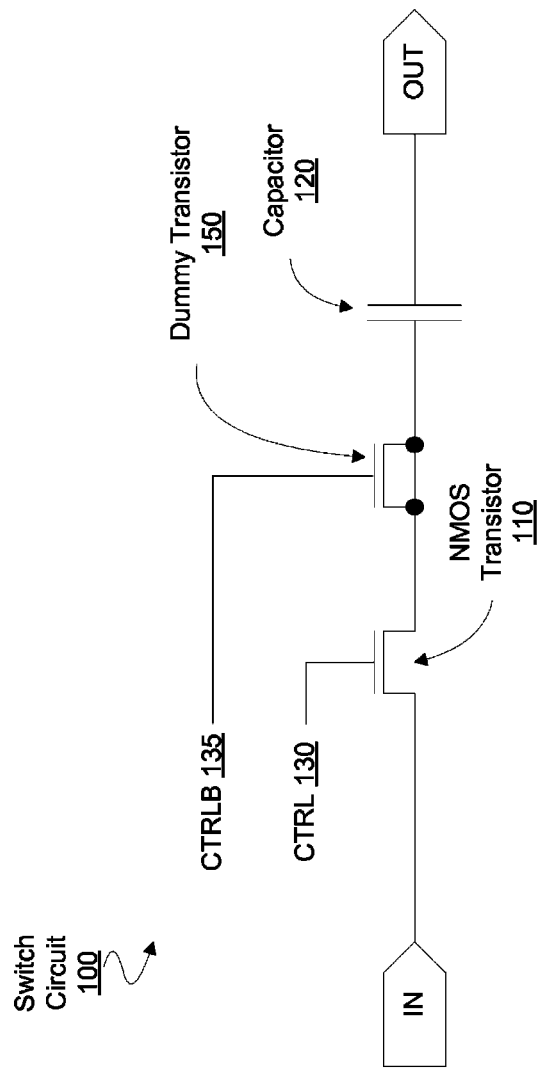
FIG. 1 is a circuit diagram illustrating elements of a conventional switch circuit.
Figure 2:
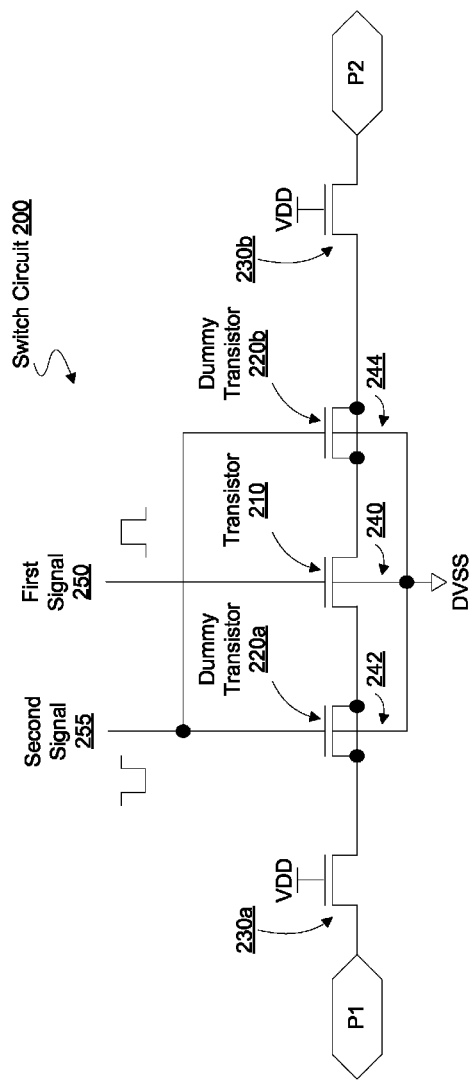
FIG. 2 is a circuit diagram illustrating elements of a switch circuit according to an embodiment.

FIG. 2 illustrates elements of a switch circuit 200 according to an embodiment. Switch circuit 200 may include transistor 210, first dummy transistor 220a and second dummy transistor 220b for controlling an exchange between a switch input node and a switch output node. Transistor 210 may, for example, be connected between first dummy transistor 220a and second dummy transistor 220b—e.g. for controlling an exchange between a switch input node at input port P1 and a switch output node at output port P2. Alternatively, the switch input node and switch output node may be nodes of larger circuitry into which switch circuit 200 is integrated.

In an embodiment, transistor 210 is to receive first signal 250, and first dummy transistor 220a and second dummy transistor 220b are each to receive second signal 255. First signal 250 and second signal 255 may provide for control of a switched exchange between input port P1 and output port P2. Ports P1, P2 may each be bidirectional ports, in one embodiment, By way of illustration and not limitation, first signal 250 may be provided at a gate of transistor 210 and second signal 255 may be provided at respective gates of first dummy transistor 220a and second dummy transistor 220b, where first signal 250 and second signal 255 are, in one or more respects, complementary to one another. For example, at some given time, first signal 250 may be at a voltage level representing a first logic state (e.g. logic high or "1") while second signal 255 is at a voltage level representing a different logic state (e.g. logic low or "0"). In an embodiment, first signal 250 may transition between logic states (e.g. logic low to logic high) at or near a time when second signal 255 undergoes an opposite transition between said logic states (e.g. logic high to logic low).

The relative configuration of transistor 210, first dummy transistor 220a and second dummy transistor 220b with respect to one another, the various providing of first signal 250 and second signal 255 and/or one or more other features of switch circuit 200 may reduce the effects of charge injection on a switched exchange between input port/node P1 and output port/node P2.

In an embodiment, transistor 210, first dummy transistor 220a and second dummy transistors 220b are each connected via respective body connections 240, 242, 244 to first low supply voltage DVSS. As used herein with respect to a transistor, the term "body connection" refers to some connecting of a body terminal of that transistor to some circuit component, supply voltage or other feature.

In an embodiment, generation of first signal 250 and/or second signal 255 may be based on first low supply voltage DVSS. By way of illustration and not limitation, switch circuit 200 may include, or be connected to, an inverter (not shown) which is to output one of first signal 250 and second signal 255, where powering of the inverter is implemented at least in part by first low supply voltage DVSS. In an embodiment, such an inverter may be further powered by first high supply voltage DVDD. First low supply voltage DVSS may be considered low at least relative to first high supply voltage DVDD—e.g. where a first low supply voltage DVSS is lower than a level of first high supply voltage DVDD.

Switch circuit 200 may further include one or more circuit elements to provide an input load and/or one or more circuit elements to provide an output load. By way of illustration and not limitation, switch circuit 200 may include first load transistor 230a connected between first dummy transistor 220a and the switch input node (represented by the illustrative input port P1). Alternatively or in addition, switch circuit 200 may include second load transistor 230b connected between second dummy transistor 220b and the switch output node (represented by the illustrative output port P2). Respective gates of first load transistor 230a and second load transistor 230b may each be connected to second high supply voltage VDD, although certain embodiments are not limited in this regard. A level of second high supply voltage VDD may, for example, be higher than a level of first high supply voltage DVDD. In an embodiment, first load transistor 230a and second load transistor 230b are each connected via respective body connections (not shown) to second low supply voltage VSS. A level of first low supply voltage DVSS may, for example, be higher than a level of such a second low supply voltage VSS. Second low supply voltage VSS may be considered low at least relative to second high supply voltage VDD—e.g. where a level of second low supply voltage VSS is lower than a level of second high supply voltage VDD.

In an embodiment, a width-to-length ratio for a channel of the transistor 210 is approximately twice as large as a width-to-length ratio for a channel of one of dummy transistors 220a, 220b. As used herein with reference to a transistor, "channel length" refers to a total distance as measured between a source of the transistor and a drain of the transistor, and "channel width" refers to a total distance of the channel as measured along such source and drain. The term "approximately," as used herein with respect to a dimension or other parameter of a transistor channel, refers to the characteristic of such a dimension or other parameter being within 10% of some value.

Additionally or alternatively, a length of a channel of one of load transistors 230a, 230b may be approximately four times as large as a length of a channel of one of dummy transistors 220a, 220b. Additionally or alternatively, a width of the channel of the one of load transistors 230a, 230b may be approximately four times as large as a width of a channel of one of dummy transistors 220a, 220b. A length of the channel of the transistor 210 may, for example, be approximately equal to a length of a channel of one of dummy transistors 220a, 220b.

Figure 3:
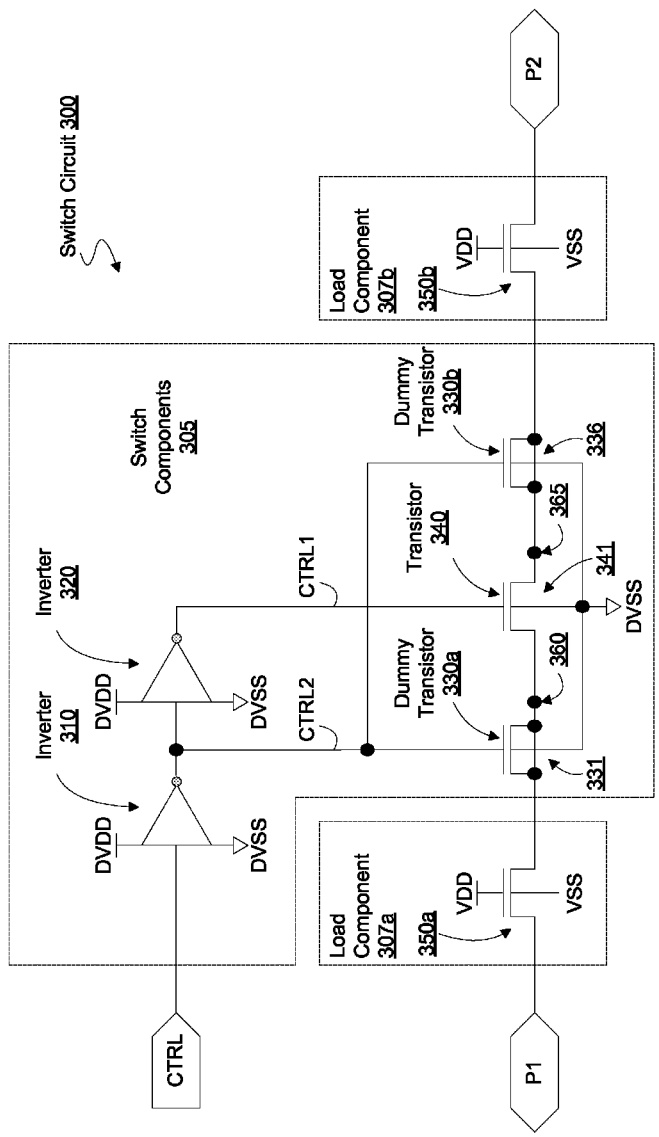
FIG. 3 is a circuit diagram illustrating elements of a switch circuit according to an embodiment.

FIG. 3 illustrates elements of switch circuit 300 in accordance with one embodiment. Switch circuit 300 may include some or all of the features of switch circuit 200, for example. In one embodiment, switch circuit 300 from FIG. 3 may be used in the readout circuit of a CMOS image sensor.

Switch circuit 300 may comprise switch components 305 and load components 307a, 307b. Switch components 305 may comprise dummy transistors 330a, 330b, and transistor 340 which, for example, provide corresponding functionality of dummy transistors 220a, 220b, and transistor 210, respectively.

Transistor 340 may be connected between first node 360 and second node 365—e.g. where dummy transistor 330a is connected to first node 360 and dummy transistor 330b is connected to second node 365. Transistors 340 and dummy transistors 330a, 330b may be NMOS transistors, in an embodiment. Additionally or alternatively, transistors 340 and dummy transistors 330a, 330b may be variously connected, via respective body connections 341, 331 and 336, to first low supply voltage DVSS. In an alternate embodiment, transistor 340 and dummy transistors 330a, 330b are each PMOS transistors variously connected via respective body connections to first high supply voltage DVDD—e.g. where CTRL is for low-enable control signaling.

In an illustrative embodiment, load components 307a, 307b include, respectively, load transistor 350a and load transistor 350b. However, load components 307a, 307b may each include any of a variety of additional or alternative circuit elements, according to different embodiments. Load transistor 350a may, for example, be coupled between node 360 and first port P1. Additionally or alternatively, load transistor 350b may be coupled between node 365 and second port P2.

In an embodiment, control signal CTRL1 may be provided to transistor 340 and another control signal CTRL2 may be provided to each of dummy transistors 330a, 330b—e.g. where CTRL1 and CTRL2 are to provide control functionality of first signal 250 and second signal 255, respectively. CTRL1 and CTRL2 may be variously generated by switch circuit 300—e.g. by inverters 310, 320 of switch components 305. Based on an input control signal CTRL, inverters 310 and 320 may output, respectively, complementary version CTRL2 and delayed version CTRL1 of CTRL.

In the illustrated embodiment, first high supply voltage DVDD and first low supply voltage DVSS provide, respectively, high supply and low supply (e.g. ground) voltages for inverters 310 and 320. Inverter 310 (and/or inverter 320) may, for example, comprise an NMOS transistor and a PMOS transistor (not shown) which are connected in series with one another between first high supply voltage DVDD and first low supply voltage DVSS. By way of illustration and not limitation, the source and body of the NMOS transistor of inverter 310 may be connected to first low supply voltage DVSS, where the source and body connection of the PMOS transistor may be connected to first high supply voltage DVDD. In an embodiment, second high supply voltage VDD and second low supply voltage VSS power operation of load transistors 350a, 350b. Inverters 310, 320 may be used to make the rising and falling edge of control signals CTRL1 and CTRL2 sharp. For example, use of comparatively small-channel transistors in inverters 310, 320 may allow for operation of inverters 310, 320 in a narrow voltage range between first low supply voltage DVSS and first high supply voltage DVDD. Operation in such a narrow voltage range may allow for CTRL1 and/or CTRL2 to have comparatively sharp transitions between logical states. In certain embodiments, a power supply circuit may float first low supply voltage DVSS and first high supply voltage DVDD. In such embodiments, inclusion of inverters 310, 320 in the design of switch circuit 300 may contribute to reduced mismatch in the operation of multiple such switch circuits—e.g. where such mismatch is due to variations in circuitry caused during IC fabrication.

The delayed version CTRL1 of CTRL may be connected to the gate of transistor 340, and the complementary version CTRL2 of CTRL connected to each of the respective gates of dummy transistors 330a, 330b. In the illustrative embodiment of FIG. 3, dummy transistors 330a, 330b may selectively operate as MOS capacitors. By way of illustration and not limitation, for each of dummy transistors 330a, 330b, the source and drain of the dummy transistor may be connected together to form one terminal of a two-terminal capacitor, with the gate of the dummy transistors forming the second terminal of the capacitor. When CTRL2 is asserted, dummy transistors 330a, 330b may each operate substantially as a capacitor, whereas when CTRL2 is de-asserted, dummy transistors 330a, 330b may operate substantially as a short circuit. Accordingly, when CTRL1 is asserted, CTRL2 may be de-asserted, and switch circuit 300 may be closed to facilitate an exchange between a switch input node and a switch output node (represented by respective ports P1, P2). When CTRL1 is de-asserted, CTRL2 may be asserted and switch circuit 300 may be opened to prevent an exchange between ports P1, P2. In another embodiment, CTRL1 and CTRL2 are provided from outside of switch circuit 300.

Dummy transistors 330a, 330b may be arranged to reduce charge injection when CTRL1 is de-asserted and CTRL2 is asserted. For example, dummy transistors 330a, 330b may be variously configured for each to store a respective amount of charge—e.g. approximately half of all charge—which switch circuit 200 might otherwise inject with operation of transistor 340. In an embodiment, the respective channels of dummy transistors 330a, 330b have approximately the same width, approximately the same length and/or approximately the same width-to-length ratio. Alternatively or in addition, the channels of dummy transistors 330a, 330b may have respective characteristics which are each related to one or more corresponding channel characteristics of transistor 340. By way of illustration and not limitation, respective channels of dummy transistors 330a, 330b may each have a width of approximately some value NW and a length of approximately some value L—e.g. resulting in the respective channels of dummy transistors 330a, 330b each having a width-to-length ratio of approximately NW/L. The values NW and L may, for example, be approximately 0.1 μm and 0.1 μm respectively, although certain embodiments are not limited in this regard.

In an embodiment, the channel of transistor 340 may have a width-to-length ratio of approximately 2 NW/L—e.g. where the channel of transistor 340 has a width of approximately 2 NW and a length of approximately L. In an embodiment, value L is a minimum feature size of one or more transistors. By way of illustration and not limitation, all elements of switch component 305 may have a minimum feature size of L. For example, inverters 310 and 320 may each include one or more transistors (not shown)—e.g. including PMOS and/or NMOS transistors—which also have a minimum feature size of L.

In the illustrated embodiment of FIG. 3, load transistors 350a, 350b are NMOS transistors, each with a respective gate connected to second high supply voltage VDD. By so providing VDD, load transistors 350a, 350b may always be on, each providing a constant level of impedance at a respective one of ports P1, P2. Load transistors 350a, 350b may further be connected via respective body connections to second low supply voltage VSS. To balance charge injection to both sides of transistor 340, loading on both sides of transistor 340 by loads 307a, 307b may be approximately equal. Transistor modeling and simulation may be used to estimate the actual loading or impedance on each side of transistor 340 to determine the impedance required of load transistors 350a, 350b.

In an embodiment, the respective elements of load components 307a, 307b each have a minimum feature size that is different from that of switch components 305. For example, load transistors 350a, 350b may each comprise NMOS transistors, where the respective channels of load transistors 350a, 350b each have a width of approximately a value DW and/or a length of approximately a value DL. The values DW and DL may, for example, be approximately 0.4 μm and 0.4 μm respectively, although certain embodiments are not limited in this regard.

In one embodiment, value DW is approximately four times larger than value NW and value DL is approximately four times larger than value L. The respective elements of loads 307a, 307b may have a minimum feature size of DL, for example. In another embodiment, the channel width and/or length of load transistor 350a are of different dimensions than those of load transistor 350b.

In another embodiment, load transistors 350a, 350b are PMOS transistors with each have a gate connected to second low supply voltage VSS, where body connections each connect the respective bodies of the PMOS transistors to second high supply voltage VDD. In yet another embodiment, loads 307a, 307b include respective resistors, such as poly resistors—e.g. in lieu of load transistors 350a, 350b.

Respective body connections for one or more NMOS transistors of switch components 305 may be connected to first low supply voltage DVSS, while respective body connections for one or more PMOS transistors of switch components 305 may be connected to first high supply voltage DVDD. Typically, variations in semiconductor fabrication may cause the voltage required to fully turn on or off the elements of conventional switch circuits to vary from chip to chip. So a supply voltage level needed for one switch circuit (such as a CMOS image sensor) fabricated on a semiconductor wafer may be different from a corresponding supply voltage level needed for another switch circuit fabricated on the same wafer. A floating first low supply voltage DVSS and first high supply voltage DVDD may be provided in certain embodiments to compensate for such fabrication variations.

In an embodiment, first low supply voltage DVSS may be greater than second low supply voltage VSS, and second high supply voltage VDD may be greater than first high supply voltage DVDD. For example, VSS, DVSS, DVDD and VDD may have respective values of 0V, +0.8V, +2.0V and +3.0V, although certain embodiments are not limited in this regard. The narrower range between DVSS and DVDD, as compared to the range between VSS and VDD, may limit the effect of voltage swing in operation of an inverter such as one or both of inverters 310, 320.

Figure 4:
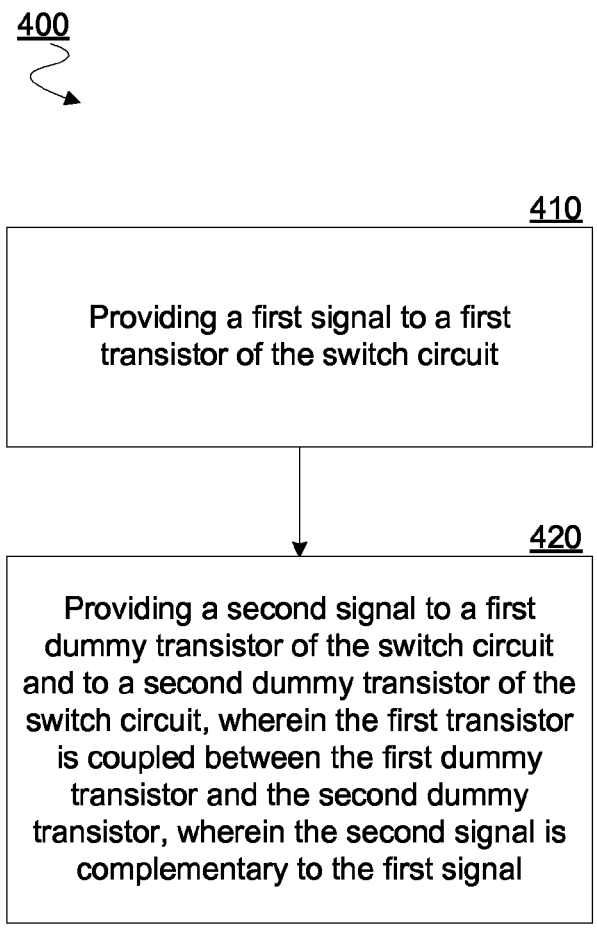
FIG. 4 is a flow diagram illustrating elements of a method for operating a switch circuit according to an embodiment.

FIG. 4 illustrates elements of a method 400 for operating a switch circuit according to an embodiment. Method 400 may operate a switch circuit having some or all of the features of switch circuit 200, for example. Alternatively or in addition, method 400 may operate switch circuit 300.

In an embodiment, method 400 comprises controlling an exchange between a switch input node and a switch output node. Such controlling may include, at 410, providing a first signal to a first transistor of the switch circuit. The providing of a signal at 410 may, for example, include providing first signal 250 at transistor 210.

The controlling of the exchange between switch input node and switch output node may further include, at 420, providing a second signal to a first dummy transistor of the switch circuit and to a second dummy transistor of the switch circuit. The providing of a signal at 420 may, for example, include providing second signal 255 at each of dummy transistors 220*a*, 220*b* 210. The second signal may, in an embodiment, be complementary to the first signal.

In an embodiment, the first transistor is connected between the first dummy transistor and the second dummy transistor. Additionally or alternatively, the first transistor, the first dummy transistor and the second dummy transistors may each be connected via respective body connections to a first low supply voltage. A first load transistor may be connected between the first dummy transistor and the switch input node. Additionally or alternatively, a second load transistor may be connected between the second dummy transistor and the switch output node. In an embodiment, the first load transistor and the second load transistor are each connected via respective body connections to a second low supply voltage—e.g. where a level of the first low supply voltage is higher than a level of the second low supply voltage. One of the first signal and the second signal may, for example, be output by an inverter powered with a first high voltage supply and the first low voltage supply. The first load transistor and the second load transistor may be further connected—e.g. via respective gate terminals—to a second high supply voltage, wherein a level of the first high supply voltage is lower than a level of the second high supply voltage.

In an embodiment, a width-to-length ratio for a channel of the first transistor is approximately twice as large as a width-to-length ratio for a channel of one of the first dummy transistor and the second dummy transistor. A length of the channel of the first transistor may be approximately equal to a length of the channel of the one of the first dummy transistor and the second dummy transistor. Alternatively or in addition, a length of a channel of one of the first load transistor and the second load transistor is approximately four times as large as a length of a channel of one of the first dummy transistor and the second dummy transistor. Additionally or alternatively, a width of the channel of the one of the first load transistor and the second load transistor may be approximately four times as large as a width of the channel of one of the first dummy transistor and the second dummy transistor.

Figure 5:
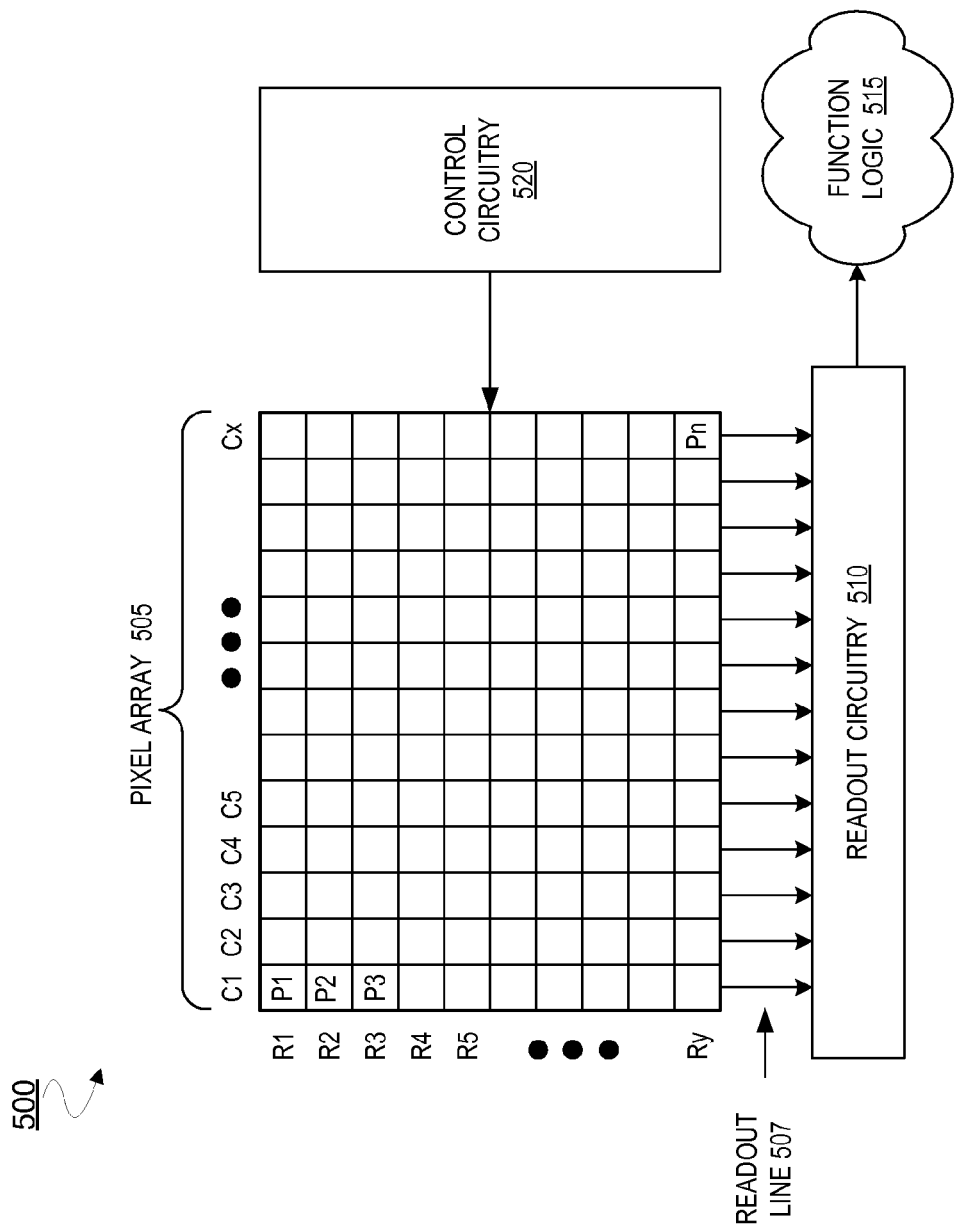
FIG. 5 is a block diagram illustrating elements of an image sensor according to an embodiment.

FIG. 5 is a functional block diagram of CMOS image sensor 500. CMOS image sensor 500 comprises pixel array 505, readout circuitry 510, function logic 515 and control circuitry 520.

Pixel array 505 may be a two-dimensional (2D) array of imaging sensor cells or pixel cells (e.g., pixels P1, P2, . . . , Pn). In one embodiment, each pixel cell is a complementary metal-oxide-semiconductor (CMOS) imaging pixel. Pixel array 505 may be implemented as a front-side illuminated image sensor or a backside illuminated image sensor. As illustrated, each pixel cell may be arranged into a row (e.g., rows R1 to Ry) and a column (e.g., column C1 to Cx) to acquire image data of a person, place or object, which can then be used to render an image of the person, place or object.

After a pixel has acquired its image data (e.g. image charge), the image data may be read out from pixel array 505 to readout circuitry 510 via a respective readout line (or bit line) 507 and transferred to function logic 515. Readout circuitry 510 may, for example, include column amplification circuitry, analog-to-digital (ADC) conversion circuitry and/or the like. Function logic 515 may store the image data and, in certain embodiments, manipulate the image data—e.g. by applying post image effects (e.g., crop, rotate, remove red eye, adjust brightness, adjust contrast and/or the like). In one embodiment, readout circuitry 510 may read out a row of image data at a time along readout column lines or may readout the image data using a variety of other techniques including, but not limited to, serial readout, column readout along readout row lines, full parallel readout of all pixels simultaneously, and/or the like. Use of the terms "row" and "column" are intended merely to differentiate the two axes relative to each other.

Control circuitry 520 may be connected to pixel array 505 and include logic and driver circuitry for controlling operational characteristics of pixel array 505. For example, reset, row select, transfer and/or other such signals may be generated by control circuitry 520. Control circuitry 520 may include a row driver and/or other control logic, in certain embodiments.

Figure 6:
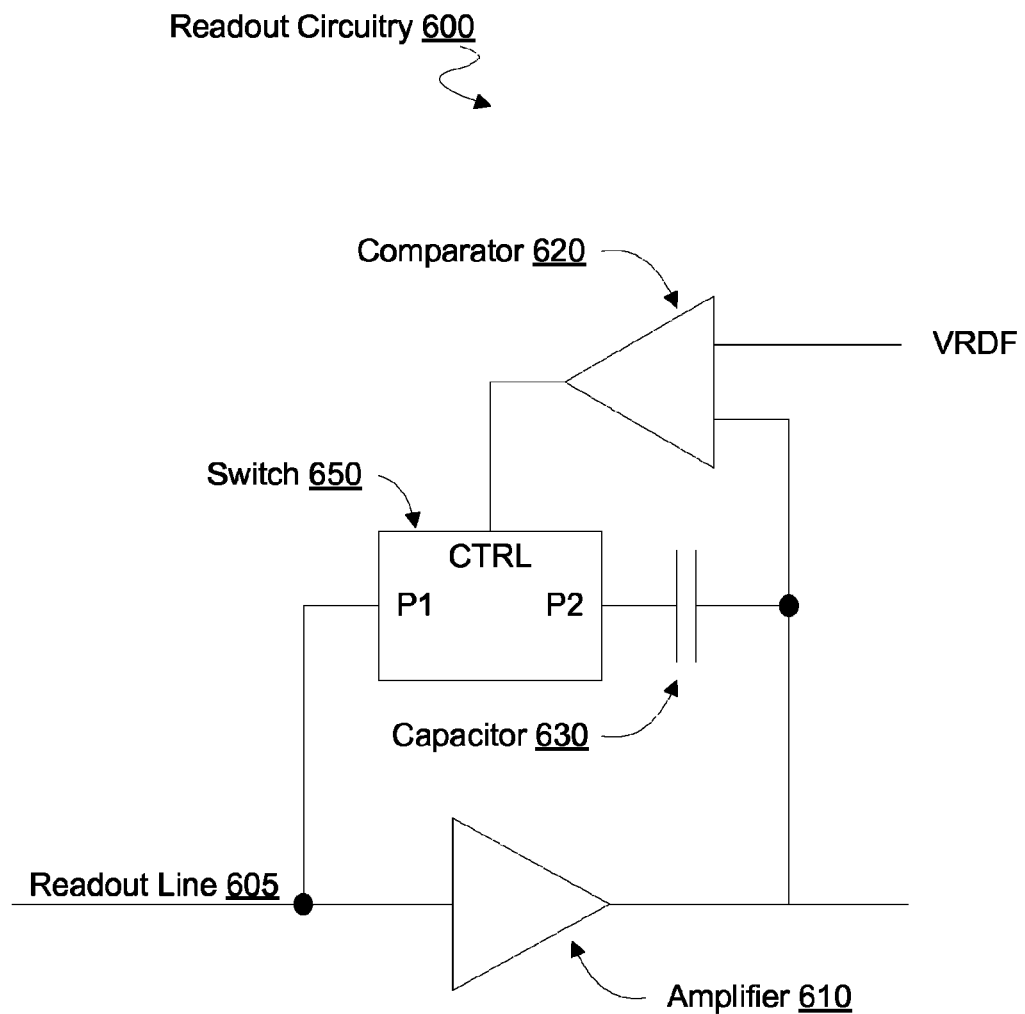
FIG. 6 is a circuit diagram illustrating elements of readout circuitry according to an embodiment.

FIG. 6 illustrates elements of readout circuitry 600 including switch 650 according to an embodiment. Readout circuitry 600 may provide functionality—such as that of readout circuitry 510—for reading image data from a pixel cell (e.g. a CMOS pixel cell) via readout line 507. In an embodiment, switch 650 includes some or all of the features of switch circuit 200—e.g. where switch 650 includes switch circuit 300. Operation of switch 650 in readout circuitry 600 may allow for a selectable dynamic gain for a CMOS image sensor. For example, readout circuitry 600 may include operational amplifier 610 to receive an image data signal read out of a pixel array via readout line 605.

Readout circuitry 600 may further include capacitor 630 and comparator 620 for operation with switch 650 based on a threshold voltage VRDF for determining whether a high dynamic gain or a low dynamic gain is to be provided. Readout line 605 may be connected both to input port P1 of amplifier 610 and to port P1 of switch 650. Output port P2 of amplifier 610 may be connected to one input of comparator 620 via capacitor 630. The output of comparator 620 may be connected to control signal input CTRL of switch 650. Capacitor 630 may be further connected between port P2 of switch 650 and the output of amplifier 610.

In an embodiment, switch 650 is operable to selectively control an exchange between the input and output of amplifier 610 via capacitor 630. At some point in time, comparator 620 may determine whether an amplified image data signal at the output of amplifier 610 is greater than threshold voltage VRDF. A signal output from comparator 620 to control input CTRL may be asserted in response to the output of amplifier 610 being greater than threshold voltage VRDF. Assertion of the signal at control input CTRL may close switch 650, resulting in a reduction of gain across amplifier 610. A low gain mode may be advantageous for achieving high dynamic gain—e.g. as is desired in bright light image-capture situations.

Alternatively, signal output from comparator 620 to control input CTRL may be de-asserted when the output of amplifier 610 is less than threshold voltage VRDF. De-asserting the signal at control input CTRL may open switch 650, preventing capacitor 630 from reducing the gain across amplifier 610. A high gain amplifier may be advantageous for achieving low dynamic gain—e.g. as is desired in low light image-capture situations.

In an embodiment, readout circuitry 600 further includes one or more additional feedback paths (not shown) for amplifier 610. By way of illustration and not limitation, a feedback capacitor and a equalizer switch are additional components which are normally included for a column amplifier circuit, or other such readout circuitry. In one embodiment, readout circuitry 600 further includes an equalizer switch coupled, in parallel with switch 650 and capacitor 630, between the input and output of operational amplifier 610. Such an equalization switch may, for example, selectively couple the input and output of operational amplifier 610 for amplifier offset cancellation. Additionally or alternatively, readout circuitry 600 may further include a feedback capacitor coupled between the input and output of operational amplifier 610 in parallel with switch 650 and capacitor 630 and, in an embodiment, further in parallel with such an equalization switch.

Figure 7:
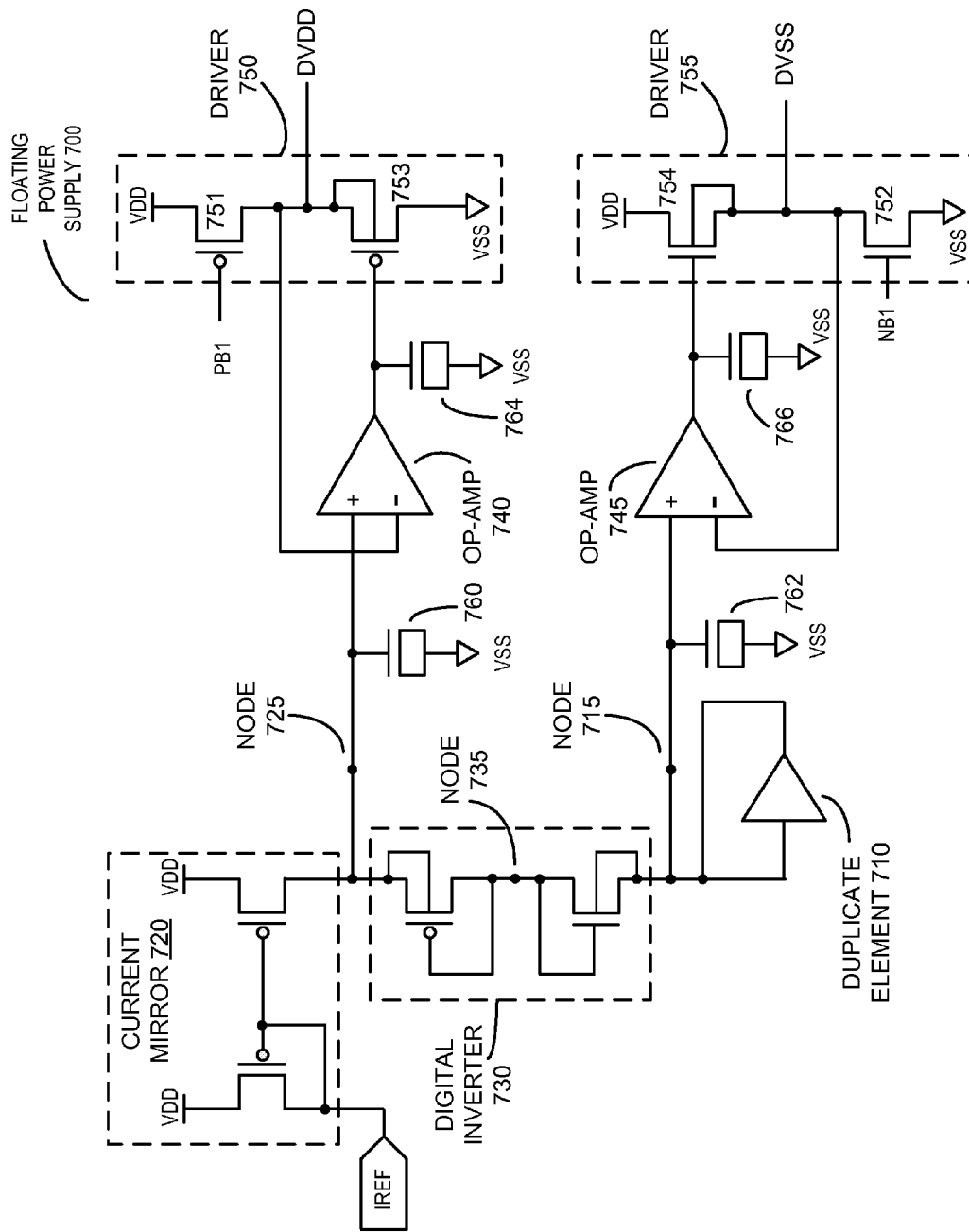
FIG. 7 is a circuit diagram illustrating elements of a power supply circuitry for a switch circuit according to an embodiment.

FIG. 7 illustrates elements of a floating power supply 700 for a switch circuit according to an embodiment. Floating power supply 700 may provide a first low supply voltage DVSS and first high supply voltage DVDD for one or more switch circuits on a semiconductor chip. For example, floating power supply 700 may provide supply voltages DVSS and DVDD to a circuit including some or all of the features of switch circuit 200—e.g. where such circuit includes switch circuit 300. In other embodiments, first low supply voltage DVSS and first high supply voltage DVDD may be generated using voltage regulators.

In an illustrative embodiment, floating power supply 700 comprises duplicate element 710, current mirror 720, digital inverter 730, operational amplifier ("OP-AMP") 740, OP-AMP 745, driver 750, driver 755, and capacitors 760, 762, 764 and 766. Unless shown otherwise in FIG. 7, a PMOS transistor in floating power supply 700 is connected by a body connection to second high supply voltage VDD, and a NMOS transistor in floating power supply 700 is connected by a body connection to second low supply voltage VSS.

In the illustrated embodiment, duplicate element 710 is equivalent to amplifier 610 of readout circuitry 600 of FIG. 6. In other embodiments, duplicate element 710 may be equivalent to another active or passive circuit element, where the input and output of such element are selectively connected together by a switch circuit powered by floating power supply 700.

The input and output of duplicate element 710 may be connected together to maintain at node 715 a voltage which is the amplifier's equalization point. A reference current IREF may be connected to the input of current mirror 720 to provide a bias current to floating power supply 700. The output of current mirror 720 may be connected to node 725 to provide at node 725 a voltage which is the sum of the voltage at node 715 and the voltage drop of digital inverter 730.

In an embodiment, the respective drain and gate terminals of the PMOS and NMOS transistors which comprise digital inverter 730 may be connected together. The body connection of the PMOS and NMOS transistors which comprise digital inverter 730 may be connected to nodes 725 and 715 respectively. The respective source connections of the PMOS and NMOS transistors which comprise digital inverter 730 may be connected to node 725 and 715, respectively. With such a configuration, the voltage swing between nodes 725 and 715 may be limited by a voltage drop through digital inverter 730. Utilization of duplicate element 710 and digital inverter 730 to determine the voltage levels of first high supply voltage DVDD and first low supply voltage DVSS may, as compared to utilization of conventional voltage step-up or step-down circuits, provide greater tolerance of variations in semiconductor fabrication. For example, use of conventional voltage step-up or step-down circuits in a semiconductor device tends to result in a supply and/or ground voltage that cannot fully and/or consistently turn on and off circuit elements, and may even damage such circuit elements.

In an embodiment, the respective non-inverting terminals of OP-AMPs 740, 745 may be connected to nodes 725 and 715, respectively. The inverting terminals of OP-AMPs 740, 745 may be connected to the outputs of drivers 750, 755 respectively. In such a configuration, OP-AMPs 740, 745 may act as voltage buffers which, for example, provide approximately identical buffer voltage characteristics.

In an embodiment, capacitor 760 may be connected to node 725, and capacitor 762 may be connected to node 715. Capacitors 764 may be connected to the output of OP-AMP 740 and capacitor 766 may be connected to the output of OP-AMP 745. Capacitors 760, 762, 764 and 766 may reduce noise so that the switch high and low voltages are each approximately DC or constant. In the illustrated embodiment, capacitors 760, 762, 764 and 766 may be NMOS capacitors connected to second low supply voltage VSS. In other embodiments, capacitors 760, 762, 764 and 766 may be PMOS capacitors connected to second high supply voltage VDD.

The output of drivers 750, 755 may be first high supply voltage DVDD and first low supply voltage DVSS, respectively. In an embodiment, driver 750 comprises PMOS transistors 751 and 753. The gate connection of PMOS transistor 751 may be connected to positive bias voltage signal PB1 and the gate connection of PMOS transistor 753 may be connected to the output of OP-AMP 740. PMOS transistor 751 may be connected between second high supply voltage VDD and first high supply voltage DVDD, while PMOS transistor 753 may be connected between first high supply voltage DVDD and second low supply voltage VSS. The body connection of PMOS transistor 753 may be connected to first high supply voltage DVDD.

Additionally or alternatively, driver 755 may comprise NMOS transistors 752 and 754. The gate connection of NMOS transistor 752 may be connected to negative bias voltage signal NB1 and the gate connection of NMOS transistor 754 may be connected to the output of OP-AMP 745. NMOS transistor 754 may be connected between second high supply voltage VDD and first low supply voltage DVSS, and NMOS transistor 752 may be connected between first low supply voltage DVSS and second low supply voltage VSS. The body connection of NMOS transistor 754 may be connected to first low supply voltage DVSS.

Techniques and architectures for switching a signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The term "connected," as used herein, means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, data or other signal.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A switch circuit comprising:
   a first transistor to receive a first signal;
   a first dummy transistor and a second dummy transistor each to receive a second signal, wherein the first transistor is connected between the first dummy transistor and the second dummy transistor, the first signal and the second signal for controlling an exchange between a switch input node and a switch output node, wherein the second signal is complementary to the first signal, and wherein the first transistor, the first dummy transistor and the second dummy transistors are each connected via respective body connections to a first low supply voltage;
   a first load transistor connected between the first dummy transistor and the switch input node; and
   a second load transistor connected between the second dummy transistor and the switch output node.

2. The switch circuit of claim 1, wherein the first load transistor and the second load transistor are each connected via respective body connections to a second low supply voltage, wherein a level of the first low supply voltage is higher than a level of the second low supply voltage.

3. The switch circuit of claim 1, further comprising:
   an inverter to output one of the first signal and the second signal, the inverter connected to a first high supply voltage and the first low supply voltage.

4. The switch circuit of claim 3, wherein the first load transistor and the second load transistor are further connected to a second high supply voltage, wherein a level of the first high supply voltage is lower than a level of the second high supply voltage.

5. The switch circuit of claim 1, wherein a width-to-length ratio for a channel of the first transistor is approximately twice as large as a width-to-length ratio for a channel of one of the first dummy transistor and the second dummy transistor.

6. The switch circuit of claim 5, wherein a length of the channel of the first transistor is approximately equal to a length of the channel of one of the first dummy transistor and the second dummy transistor.

7. The switch circuit of claim 1, wherein a length of a channel of one of the first load transistor and the second load transistor is approximately four times as large as a length of a channel of one of the first dummy transistor and the second dummy transistor, and wherein a width of the channel of the one of the first load transistor and the second load transistor is approximately four times as large as a width of the channel of the one of the first dummy transistor and the second dummy transistor.

8. A method comprising:
   controlling with a switch circuit an exchange between a switch input node and a switch output node, the controlling including:
      providing a first signal to a first transistor of the switch circuit; and
      providing a second signal to a first dummy transistor of the switch circuit and to a second dummy transistor of the switch circuit;
   wherein the first transistor is connected between the first dummy transistor and the second dummy transistor, wherein the second signal is complementary to the first signal, wherein the first transistor, the first dummy transistor and the second dummy transistors are each connected via respective body connections to a first low supply voltage, wherein a first load transistor is connected between the first dummy transistor and the switch input node, and wherein a second load transistor is connected between the second dummy transistor and the switch output node.

9. The method of claim 8, wherein the first load transistor and the second load transistor are each connected via respective body connections to a second low supply voltage, wherein a level of the first low supply voltage is higher than a level of the second low supply voltage.

10. The method of claim 8, wherein one of the first signal and the second signal is output by an inverter connected to a first high supply voltage and the first low supply voltage.

11. The method of claim 10, wherein the first load transistor and the second load transistor are further connected to a second high supply voltage, wherein a level of the first high supply voltage is lower than a level of the second high supply voltage.

12. The method of claim 8, wherein a width-to-length ratio for a channel of the first transistor is approximately twice as large as a width-to-length ratio for a channel of one of the first dummy transistor and the second dummy transistor.

13. The method of claim 12, wherein a length of the channel of the first transistor is approximately equal to a length of the channel of one of the first dummy transistor and the second dummy transistor.

14. The method of claim 8, wherein a length of a channel of one of the first load transistor and the second load transistor is approximately four times as large as a length of a channel of one of the first dummy transistor and the second dummy transistor, and wherein a width of the channel of the one of the first load transistor and the second load transistor is approximately four times as large as a width of the channel of the one of the first dummy transistor and the second dummy transistor.

15. An image sensor comprising:
   a pixel array including a plurality of pixel cells to capture image data;
   a bit line coupled to a first pixel cell of the plurality of pixel cells; and
   readout circuitry coupled to read the image data from the bit line, the readout circuitry including a switch circuit comprising:
      a first transistor to receive a first signal;
      a first dummy transistor and a second dummy transistor each to receive a second signal, wherein the first transistor is connected between the first dummy transistor and the second dummy transistor, the first signal and the second signal for controlling an exchange between a switch input node and a switch output node, wherein the second signal is complementary to the first signal, and wherein the first transistor, the first dummy transistor and the second dummy transistors are each connected via respective body connections to a first low supply voltage;
      a first load transistor connected between the first dummy transistor and the switch input node; and
      a second load transistor connected between the second dummy transistor and the switch output node.

16. The image sensor of claim 15 wherein the first load transistor and the second load transistor are each connected via respective body connections to a second low supply voltage, wherein a level of the first low supply voltage is higher than a level of the second low supply voltage.

17. The image sensor of claim 15, the switch circuit further comprising:
   an inverter to output one of the first signal and the second signal, the inverter connected to a first high supply voltage and the first low supply voltage.

18. The image sensor of claim 17, wherein the first load transistor and the second load transistor are further connected to a second high supply voltage, wherein a level of the first high supply voltage is lower than a level of the second high supply voltage.

19. The image sensor of claim 15, wherein a width-to-length ratio for a channel of the first transistor is least approximately twice as large as a width-to-length ratio for a channel of one of the first dummy transistor and the second dummy transistor.

* * * * *